(12) United States Patent
Kawai et al.

(10) Patent No.: US 6,636,001 B2
(45) Date of Patent: Oct. 21, 2003

(54) ORGANIC ELECTRONIC DEVICE AND NONLINEAR DEVICE

(75) Inventors: Tatsundo Kawai, Hadano (JP); Akihiro Senoo, Kawasaki (JP); Kazunori Ueno, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/029,931

(22) Filed: Dec. 31, 2001

(65) Prior Publication Data

US 2002/0109464 A1 Aug. 15, 2002

(30) Foreign Application Priority Data

Jan. 9, 2001 (JP) ...................................... 2001-000963

(51) Int. Cl.⁷ .............................................. H05B 33/12
(52) U.S. Cl. ..................... 315/169.3; 313/504; 313/506; 428/690; 315/368.19
(58) Field of Search ........................... 315/169.3, 169.4, 315/368.19; 428/690, 704, 917, 457, 332, 213; 313/502–506

(56) References Cited

U.S. PATENT DOCUMENTS

| | | | |
|---|---|---|---|
| 3,172,762 A | 3/1965 | Wilson | 75/153 |
| 3,173,050 A | 3/1965 | Gurnee | 313/108 |
| 3,710,167 A | 1/1973 | Dresner et al. | 313/108 |
| 4,356,429 A | 10/1982 | Tang | 313/503 |
| 5,989,737 A | * 11/1999 | Xie et al. | 428/690 |
| 6,465,115 B2 | * 10/2002 | Shi et al. | 428/690 |

OTHER PUBLICATIONS

Pope, M., H.P. Kallmann, and P. Magnante, "Electroluminescence in Organic Crystals", Journal of Chem. Physics, 1963, vol. 38, pp. 2042–2043.

Helfrich, W. and W. G. Schneider, "Recombination Radiation in Anthracene Crystals", Phys. Rev. Lett., Feb. 15, 1965, vol. 14, No. 7, pp. 229–231.

Helfrich, W. and W. G. Schneider, "Transients of Volume-Controlled Current and of Recombination Radiation in Anthracene", Journal of Chem. Physics, Apr. 15, 1966, vol. 44, No. 8, pp. 2902–2909.

Schwob, H. P. and D. F. Williams, "Charge transfer exciton fission in anthracene crystals", Journal of Chem. Physics, Feb. 15, 1973, vol. 58, No. 4, pp. 1542–1547.

Kalinowski, J. and J. Godlewski, "Magnetic Field Effects on Recombination Radiation in Tetracene Crystal", Chem. Physics Lett., Nov. 15, 1975, vol. 36, No. 3, pp. 345–348.

Tang, C. W. and S. A. VanSlyke, "Organic electroluminescent diodes", Appl. Phys. Lett., Sep. 21, 1987, vol. 51, No. 12, pp. 913–915.

* cited by examiner

*Primary Examiner*—Don Wong
*Assistant Examiner*—Wilson Lee
(74) *Attorney, Agent, or Firm*—Fitzpatrick, Cella, Harper & Scinto

(57) ABSTRACT

An organic electronic device functioning as a flat EL display panel is provided by forming an organic EL element and a nonlinear device as a drive means for controlling a current supplied to the EL device on a common substrate. The nonlinear device has a structure including a first organic layer and a second organic layer each comprising an organic material, and at least one metal layer principally comprising a metal element and sandwiched between the first and second organic layers so as to flow at least a part of current through the metal layer between the first and second organic layers sandwiching the metal layer. The nonlinear device having a function comparable to a conventional organic transistor or diode can be formed by using not a special organic material having a remarkably high mobility but an organic material selected from a broader class of materials.

6 Claims, 10 Drawing Sheets

ORGANIC ELECTRONIC DEVICE AND NONLINEAR DEVICE

FIELD OF THE INVENTION AND RELATED ART

The present invention relates to an organic electronic device including a charge-injection-type luminescence device having an organic active layer and a drive circuit therefor formed integrally on a common substrate, and also a nonlinear device having an organic layer therefor.

As a charge injection-type luminescence device, a light-emitting diode (LED) using an inorganic single crystal of CaAs, GaP, GaN, etc., has been widely used, but research work on organic luminescence materials has also been made for a long time. For example, Pope, et al., reported an electric field luminescence phenomenon by using an anthracene single crystal in 1963 (J. Chem. Phys. 38 (1963) 2042). Further, Helfrich and Schneider succeeded in observation of relatively strong EL (electroluminescence) by using a solution electrode system in 1965 (Phys. Rev. Lett. 14 (1965) 229).

Thereafter, various studies for providing organic luminescence materials have been made as reported in, e.g., U.S. Pat. Nos. 3,172,762; 3,173,050; 3,710,167; J. Chem. Phys. 44 (1966) 2902: J. Chem. Phys. 50 (1969) 14364; J. Chem. Phys. 58 (1973) 1542 and Chem. Phys. Lett. 36 (1975) 345, but devices of commercial level have not been provided because of problems, such as weak luminescence intensity and necessity of high voltages for luminescence.

In recent years, however, Tang, et al., have developed an organic EL device comprising very thin vacuum deposition layers (a charge-transporting layer and a luminescence layer) and have realized a high luminance at low drive voltages (Appl. Phys. Lett. 51 (1987) 913 or U.S. Pat. No. 4,356,429). This lamination type of organic luminescence devices have been actively studied since then, and the possibility of various applications thereof, including a flat panel display, is becoming practical recently.

FIG. 9 shows a representative laminate structure of such an organic EL device, including a substrate 500; a transparent electrode 501 comprising indium/tin oxide (ITO) and functioning as an anode of an organic EL device as a luminescence device; a hole-transporting layer 502 comprising an organic hole-transporting material, such as an aromatic diamine as represented by formula (1) below; an electron-transporting layer 503 comprising an electron-transporting material, such as tris(8-quinolynol)-aluminum complex (or tris(8-quinolynalato)aluminum complex) generally identified as Alq3, is represented by formula (2) below; and a cathode 504 comprising a material having a low work function, such as Al or Mg:Ag alloy.

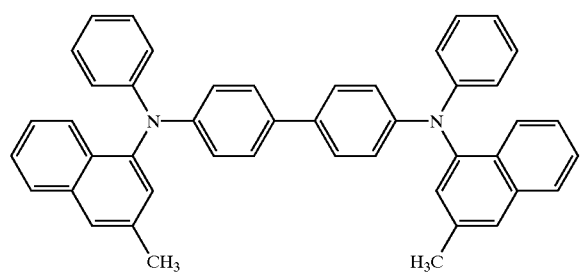

(1)

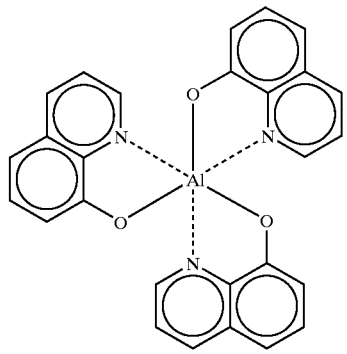

(2)

When a voltage is applied between the anode 501 and the cathode of the organic EL device, holes injected from the anode 401 into the hole-transporting layer 502 and electrons injected from the cathode 504 into the electron-transporting layer 503 (optionally via an optional electron-injection layer) are recombined to cause luminescence.

When such an organic EL device is applied to a flat panel display, it is necessary to arrange a plurality of pixels each comprising such an organic EL device and control the luminescence at the respective pixels independently. For this purpose, it is the simplest way to form a simple matrix structure by forming a plurality of parallel anode stripes on a substrate, forming thereon organic layers including a hole-transporting layer and an electron-transporting layer, and forming thereon a plurality of parallel cathode stripes intersecting with the anode stripes at right angles so as to form a pixel at each intersection of the anodes and the cathodes. For driving the simple matrix device, the mutually parallel cathodes are sequentially connected one at a time to a negative power supply with the other cathodes open, and in synchronism therewith, the anodes are selectively connected to a positive power supply or made open. As a result, only when a certain cathode is connected to the negative power supply, the respective pixels on the cathode are selectively turned on or off depending on whether or not the associated anodes are connected to the positive power supply.

This drive system is simple but is accompanied with a difficulty that the pixel lighting duty is lowered if the number of cathode lines are increased, since in the system only one among the plurality of cathode lines is connected to the negative power supply at a certain instant, and only the pixels on the line are selectively turned on or off depending on whether or not the associated anodes are connected to the positive power supply and the other pixels are extinguished regardless of whether the associated anodes are connected or not. As a result, even if a high luminance is attained at the instant of turn-on, an effective luminance as an average over a certain period is lowered if the number of cathode lines are increased corresponding to an increased number of pixels.

For obviating the above problem, an organic EL device equipped with a transistor at each pixel has been proposed. FIG. 10 is an equivalent circuit diagram of one pixel of such an organic EL device.

Referring to FIG. 10, a pixel unit includes a first thin film transistor (address transistor) 601, a storage capacitor 602, a second thin film transistor (drive transistor) 603, an organic EL device 604 functioning as an organic EL element 604 as a luminescence element, an electrode Pd connected to a source electrode of the address transistor, an electrode Pc connected to a second side of the storage capacitor 602 and a gate electrode of the drive transistor 603, an electrode Ps connected to a gate electrode of the address transistor 601, an electrode Pv connected to a first side of the storage capacitor 602 and a source electrode of the drive transistor 603, and an electrode Pled connected to a cathode of the organic EL element 604.

Ps is supplied with a selection signal, Pd is supplied with a data, and at Pc is developed a potential depending on the data signal by the charging and discharging of the storage capacitor 602. Pv and Pled are placed at fixed potentials.

The circuit operates as follows.

When a selection signal supplied to Ps is placed in a selection state ("high"), the potential at Ps is raised. As a result, the source-drain channel of the address transistor 61 is made conductive so that a current corresponding to a data signal supplied to Pd is flowed to the storage capacitor 602, whereby a potential difference between the source electrode and the gate electrode of the drive transistor 603, i.e., a potential difference between Pv and Pc, becomes a value corresponding to the data signal supplied to Pd. Accordingly, a current corresponding to the data signal flows through the drive transistor 603 so that the organic EL element 604 causes luminescence at a luminance corresponding to the data signal. When the selection signal supplied to Ps is placed in a non-selection state ("low"), the source-drain channel of the address transistor is made non-conductive, no current flows to the storage capacitor 602 even when the data signal supplied to Pd is changed, so that the potential difference between Pc and Pv is not substantially changed and the luminescence at the organic EL element is not substantially affected thereby.

In such an organic EL device, as described above, each pixel is equipped with an address transistor, a drive transistor and a storage capacitor, and a charge corresponding to a data signal in a selection period is stored at the storage capacitor, whereby the organic EL element at the pixel continually causes luminescence corresponding to the stored charge even in the non-selection period. Accordingly, there is attained an advantage that the luminescence duty at each pixel is kept high without causing a lowering in effective luminance even if the entire device includes a large number of pixels.

The transistors disposed at each pixel are ordinarily thin film electric field-type transistors made of polysilicon or amorphous silicon.

However, in order to form such an organic EL device, after a whole process of forming a thin-film transistor made of polycrystalline silicon or amorphous silicon on a substrate, it is necessary to further apply a process of forming organic EL elements. The thin-film transistor forming process includes a time-consuming step of depositing an amorphous silicon film by a plasma CVD apparatus and a troublesome and time-consuming step for converting the deposited amorphous silicon film into a polysilicon film by laser light scanning for annealing of the amorphous silicon film and this is a substantial cost-increasing factor.

In view of the above, a method of forming a pixel transistor with organic layers has been proposed so as to simplify the process compared with the conventional method of forming transistors with amorphous or polycrystalline silicon.

In order to produce also a transistor with organic layers, an organization as described below may be conceived of.

FIG. 11 is a schematic partial plan view showing on pixel region of such an organic EL device, including a first transistor (address transistor) 701 constituting the pixel, a storage capacitor 702, a second transistor (drive transistor) 703 and an organic EL element 704 as a luminescence element.

FIG. 12 is a partial sectional view of an A—A' section in FIG. 11 of the organic EL device, including the first transistor 701, (the storage capacitor 702), the second transistor 703 and the organic EL element 704.

The first transistor 701 functioning as an address transistor includes a gate electrode 801 comprising Cr, a gate insulating layer 802 comprising $SiO_2$, an active layer 803 comprising oligo-thiophene represented by e.g., a structural formula (3) shown below, and a source electrode 805 and a drain electrode 806 respectively comprising Au. The second transistor 703 functioning as a drive transistor includes a gate electrode 801 comprising Cr, a gate insulating layer 902 comprising $SiO_2$, an active layer 903 comprising oligo-thiophene, and a source electrode 905 and a drain electrode 906 comprising Au. The organic EL element 704 functioning as a luminescence element includes a transparent electrode 1001 functioning as an anode comprising indium/tin oxide (ITO), a hole-injection layer 1002 comprising copper-phthalocyanine represented by formula (4) shown below, a hole-transporting layer 1003 comprising an aromatic diamine as mentioned above, an electron-transporting and luminescence layer 1004 comprising tris(8-quinolynol) aluminum complex as mentioned above, an electron-injection layer 1005 comprising LiF and a cathode 1006 comprising Al.

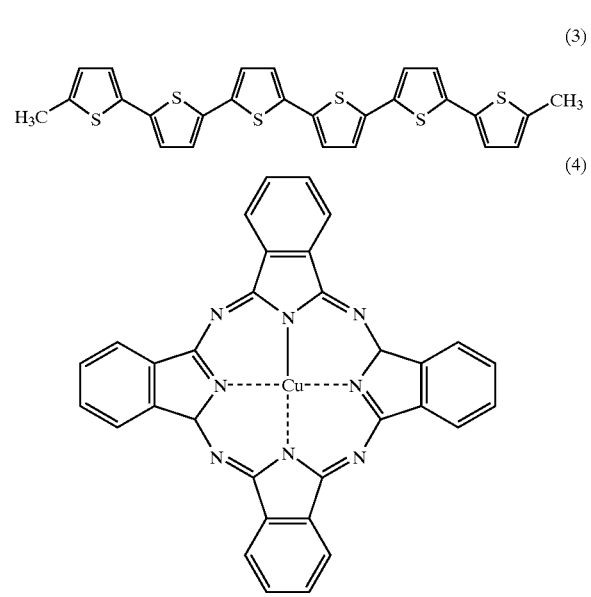

(3)

(4)

By adopting a structure as illustrated in FIGS. 10 and 11, drive transistors can be formed of without using inorganic semiconductors, such as amorphous or polycrystalline silicon, to obviate a time-consuming and expensive process attributable to the device-forming process using such amorphous or polycrystalline silicon.

However, according to the device structure including an organic transistor as illustrated in FIGS. 10 and 11, charges have to be transferred over a long distance through an active organic layer in a planar direction. As organic materials generally show a low carrier mobility, the requirement for a higher mobility organic material narrows the latitude of material selection and has provided an obstacle for commercialization.

SUMMARY OF THE INVENTION

In view of the above-mentioned problems, a principal object of the present invention is to provide an organic electronic device including an organic luminescence device and a drive means therefor, which is easy to produce, highly reliable and inexpensive.

Another object of the present invention is to provide a nonlinear device which has a function corresponding to an organic transistor as mentioned above, can be formed by using not a special organic material exhibiting a remarkably high mobility but an organic material selected from a broader class, and is therefore suitable as a drive means for the above-mentioned organic electronic device.

According to the present invention, there is provided an organic electronic device, comprising a common substrate; an organic luminescence device formed on the common substrate and comprising an anode, a cathode and an organic luminescence layer disposed between the anode and cathode; and a nonlinear device formed on the common substrate for controlling a current flowing to the organic luminescence device;

wherein the nonlinear device has a structure including a first organic layer and a second organic layer each comprising an organic material, and at least one metal layer principally comprising a metal element and sandwiched between the first and second organic layers so as to flow at least a part of current flowing through the metal layer between the first and second organic layers sandwiching the metal layer.

The present invention further provides a nonlinear device, having a laminate structure including a first electrode, a first organic layer, a metal layer, a second organic layer and a second-electrode successively disposed on a substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
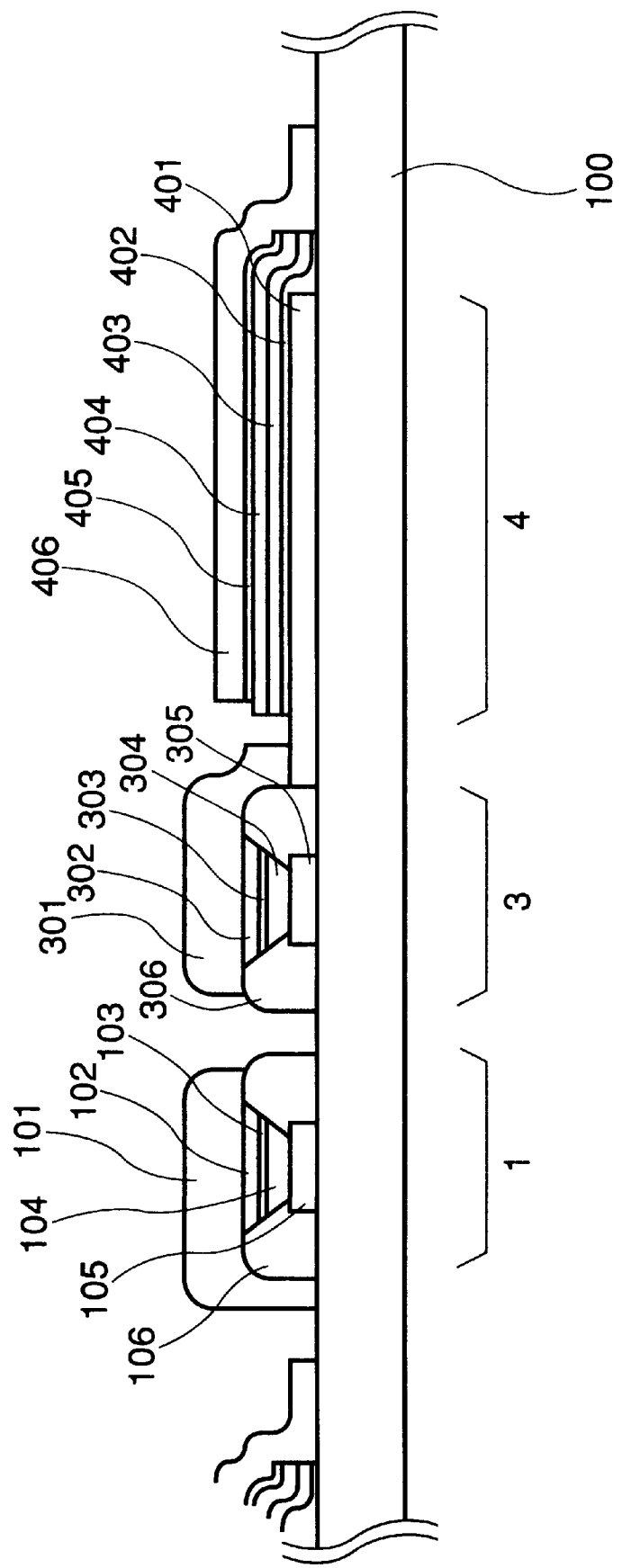
FIG. 1 is a partial sectional view of a first embodiment of the organic electronic device (organic EL device) according to the invention.

FIG. 1 is a partial sectional view of a first embodiment of the organic electronic device (organic EL device) according to the present invention, showing a sectional organization of one pixel region of the device.

Referring to FIG. 1, a pixel includes a first nonlinear device 1, a second nonlinear device 3 and an organic EL element 4 functioning as a luminescence element formed on a common substrate 100. The first nonlinear device 1 includes a first organic layer 102, a first electrode 101 connected to the first organic layer, a metal layer 103, a second organic layer 104, a second electrode 105 connected to the second organic layer, and an insulating layer 106. In other words, on the substrate 100 are successively formed the second electrode 101 connected to the second organic layer, the second organic layer 102, the metal layer 103, the first organic layer 104, and the first electrode 105 connected to the first organic layer. This laminate structure represents a nonlinear device of the present invention. The second nonlinear device 3 has an identical structure as the first nonlinear device, thus including a first electrode 301, a first organic layer 302, a metal layer 303, a second organic layer 304, a second electrode 305 and an insulating layer 306.

The organic EL element 4 includes a transparent electrode 401, a hole-injection layer 402, a hole-transporting layer 403, an electron-transporting and luminescence layer 404, an electron-injection layer 405 and a cathode 406.

[First Organic Layer]

The first organic layer (102 or 302) may comprise, e.g., tris(8-quinolynol) aluminum complex (Alq3), or another metal complex or another organic material, such as tetraphenylbutadiene, oxadiazole derivative or triazole derivative, showing an electron-transporting characteristic. The first organic layer may be required to exhibit an electron-transporting mobility on the order of at least $1\times10^{-5}$ $[cm^2/V.s]$, practically desirably at least $1\times10^{-3}$ $[cm^2/V.s]$.

The organic material constituting the first organic layer may preferably have a low hole-transporting characteristic but can have some level of hole-transporting ability as far as it has a highest occupied molecular orbital ("HOMO") energy level which is sufficiently lower than the Fermi level of the metal layer (103 or 303) sandwiched between the organic layers. On the other hand, a certain HOMO level is allowed if the organic material exhibits a sufficiently low hole mobility.

[Second Organic Layer]

The second organic layer (104 or 304) may also comprise a various electron-transporting material similarly as the first organic layer. The same or different material compared with that of the first organic layer may be used.

[Metal Layer]

The metal layer (103 or 303) may comprise a various metal, such as Au, or alloy thereof, and can comprise a material, such as a metal silicide, containing a non-metal element. It is required for the metal layer to have a Fermi level which is lower than the lowest unoccupied molecular orbital ("LUMO") level of the second organic layer (103 or 304). It is preferred that the Fermi level of the metal layer is higher than the HOMO level of the second organic layer.

[First Electrode Connected to the First Organic Layer]

The second electrode (105 or 305) may comprise a metal having a low work function (high Fermi level), such as Al, Al—Li, or Mg—Ag alloy, magnesium, indium or calcium. Theoretically, it is desirable that the Fermi level is identical to or higher than the LUMO level of the first organic layer. However, there are few materials satisfying this condition and such materials may have a difficulty, such as easy oxidizability. For this reason, it is practically possible to use a material having a Fermi level lower than the LUMO level of the first organic layer. In this case, it is effective to insert an electron-injection layer between the first electrode and the first organic layer. The electron-injection layer may comprise an electron-injecting material, e.g., a Li compound, such as LiF, or another material. It is also possible to insert an insulating layer, such as an $SiO_2$ layer, between the metal electrode and the first organic layer to effect tunnel injection of the carriers.

[Second Electrode Connected to the Second Organic Layer]

The second electrode (105 or 305) connected to the second organic layer may also comprise a various metal. The second electrode does not inject electrons into the second organic layer. Accordingly, the second electrode may preferably comprise a material having a Fermi level which is identical to or lower than the LUMO level of the second organic layer. In addition to Al, it is also possible to use a metal, such as Au, Ag, palladium or platinum; a metal oxide, such as indium/tin oxide (ITO), or an electro-conductive polymer.

EXAMPLES

Hereinbelow, the present invention will be described more specifically based on Examples, which however should not be construed to restrict the scope of the present invention.

Example 1

FIG. 1 is a sectional view of one pixel region of a first example of an organic electronic device (organic EL device) of the present invention.

Referring to FIG. 1, one pixel region of the organic EL device includes a first nonlinear device 1, a second nonlinear device 3 and an organic EL element 4 disposed on a common substrate 100. A storage capacitor (2) is disposed behind the first nonlinear device 1 but not shown in this figure.

The first nonlinear device 1 includes a first electrode 101 of Al of, e.g., 1000 Å in thickness connected to a first organic layer 102 of, e.g., 6000 Å in thickness, the first organic layer 102 comprising tris(8-quinolynol)aluminum complex (Alq3), a metal layer 103 of Au of, e.g., 100 Å in thickness, a second organic layer 104 of Alq3 of, e.g., 600 Å in thickness, a second electrode 105 of Al of, e.g., 1000 Å in thickness connected to the second organic layer 104 and also an insulating layer 106 of $SiO_2$ of, e.g., 2300 Å in thickness.

The second nonlinear device 3 has an identical structure as the first nonlinear device 1 thus including a first electrode 301 of Al, a first organic layer 302 of Alq3, a metal layer 303 of Au, a second organic layer 304 of Alq3, a second electrode 305 of Al and an insulating layer 306 of $SiO_2$.

The organic EL element 4 includes a transparent electrode 401 of indium/tin oxide (ITO), a hole-injection layer 402 of copper phthalocyanine, a hole transporting layer 403 of aromatic diamine, an electron-transporting and luminescence layer 404 of tris(8-quinolynol) complex (Alq3), an electron injection layer 405 of AlLi and a cathode 406 of Al.

Figure 2:
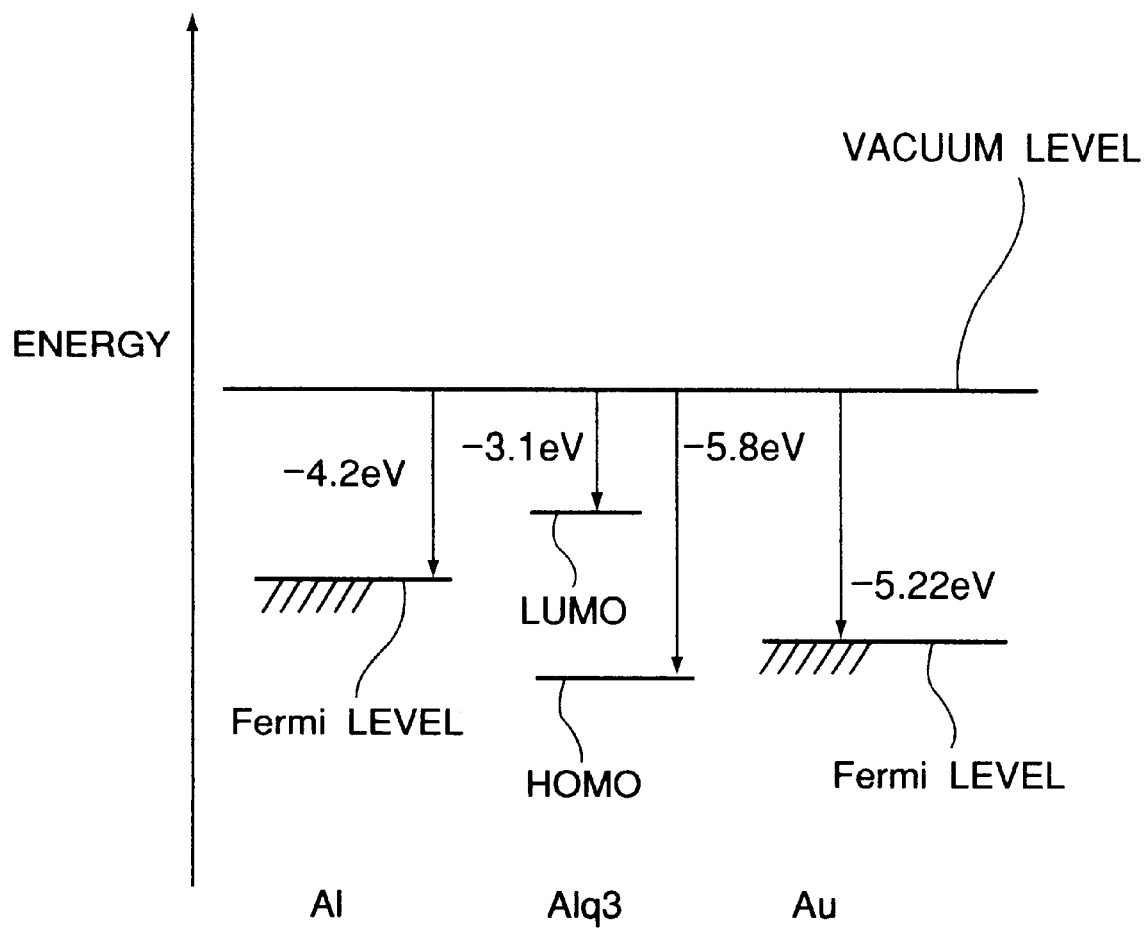
FIG. 2 is a diagram showing energy levels of materials used in the nonlinear device shown in FIG. 1.

FIG. 2 is an energy diagram showing energy levels of materials constituting the metal layer and two organic layers of each nonlinear device (1 or 3) used in this Example.

Au used in the metal layer and Al used in the electrodes connected to the organic layers exhibited Fermi levels of −5.22 eV and −4.2 eV, respectively, with reference to the vacuum energy level as measured by the photoelectron emission method.

Alq3 used for both the first and second organic layers exhibited a HOMO energy level of −5.8 eV as measured by the photoelectron emission method. By adding a level gap of 2.7 eV obtained from the absorption spectrum, the LUMO energy level was determined at −3.1 eV.

Further, Alq3 exhibited a reduction potential of −2.3 eV at a liquid temperature of 20° C. as measured by using a saturated calomel reference electrode and an electrolytic solution of 0.1 mol-solution in dichloromethane of n-butylammonium perchlorate.

Figure 3:
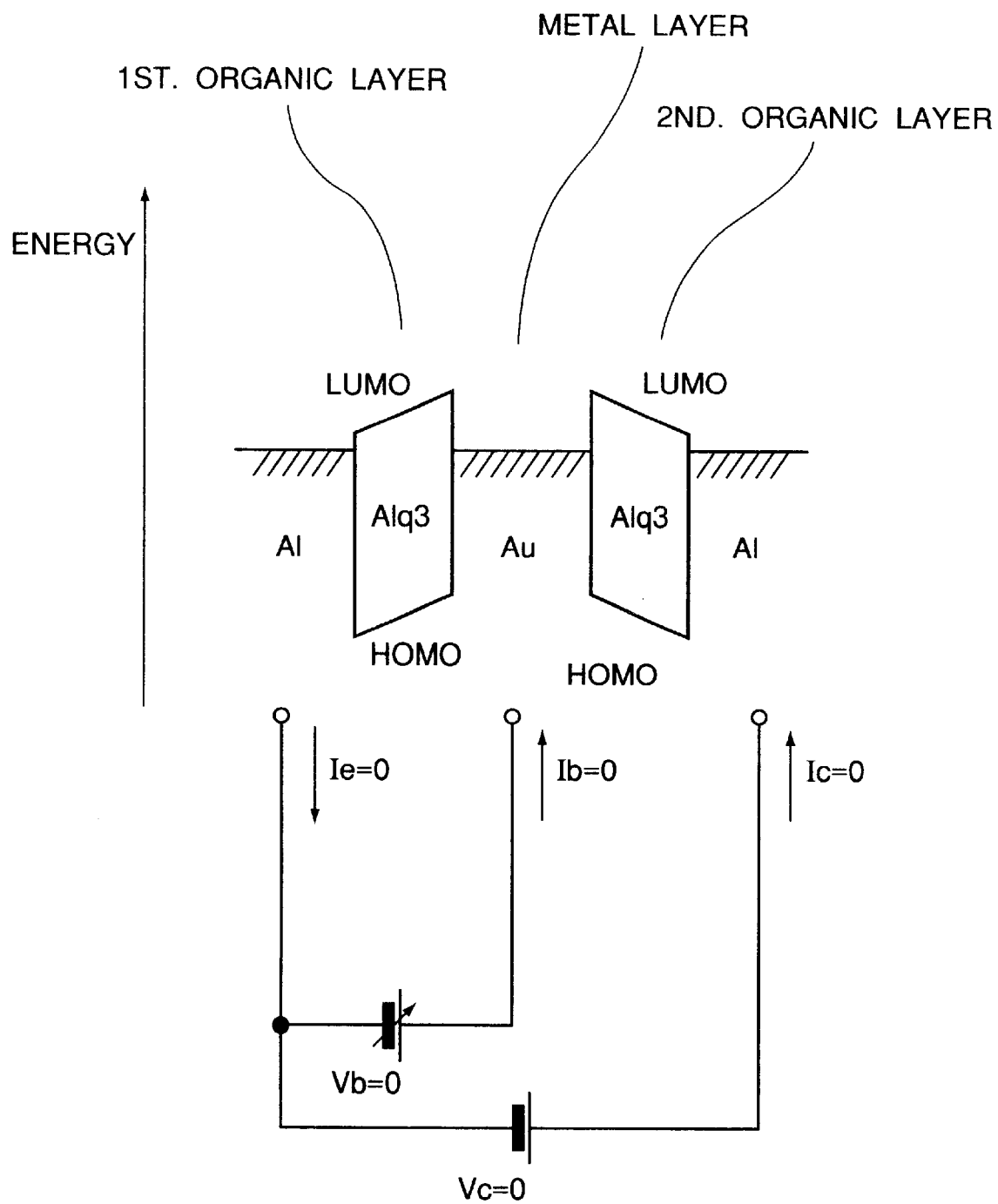
FIGS. 3 and 4 are energy level diagrams showing an interrupting state and an operating state, respectively, of the nonlinear device shown in FIG. 1.
Figure 4:
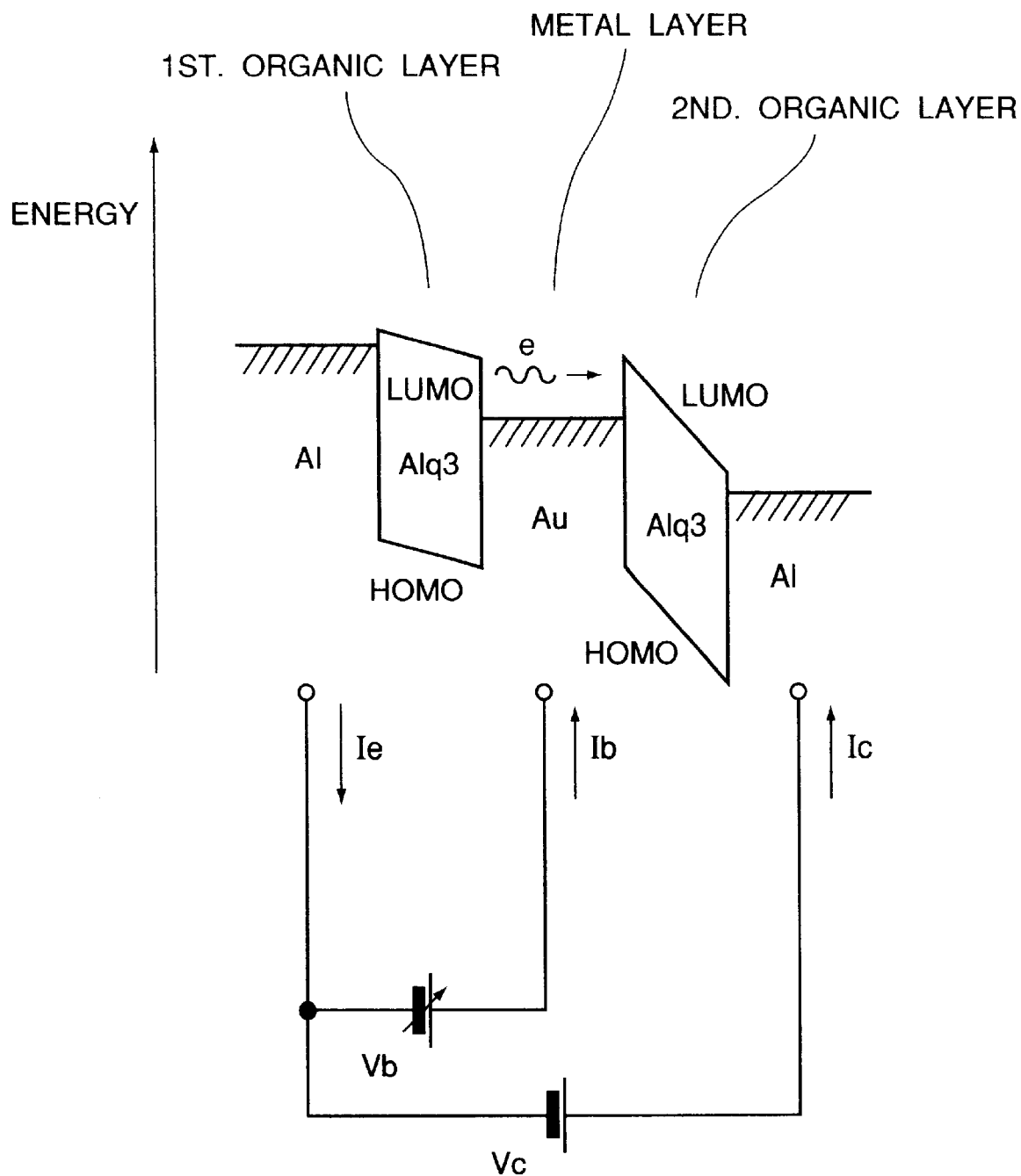

FIGS. 3 and 4 are energy diagrams for illustrating the operation principle of the nonlinear device of this Example, including FIG. 3 showing an interruption state and FIG. 4 showing an operation state.

In operation, a voltage Vc is applied between the first and second organic layers via the first and second electrodes, respectively, a voltage between the first organic layer and the metal layer is denoted by Vb.

In the interruption state shown in FIG. 3, Vb is 0, so that carriers are not injected from the first organic layer into the metal layer, and because of an energy barrier between the metal layer and the second organic layer, carriers are not injected, whereby no current flows.

In the operation state shown in FIG. 4, Vb is applied, and electrons conducted by hopping through LUMO of the first organic layer are emitted to the metal layer. Among the emitted electrons, a portion is caused to have a lower energy by scattering, thus flowing a conduction electrons to provide a current Ib. The other electrons having obviated energy loss pierce through the metal layer as hot electron to reach the second organic layer, thus providing a current Ic.

On the other hand, the HOMO energy levels of the first and second organic layers are substantially lower than the Fermi level of the metal layer sandwiched therebetween and the Fermi level of the second electrode connected to the second organic layer, so that the number of holes flowing reversely from the metal layer or the electrode to the organic layers is very few. Further, as the first and second organic layers both do not show a substantial mobility for holes, substantially no holes move through the organic layers. Consequently, the current attributable to contribution of holes is substantially negligible.

The magnitudes of Ib and Ic vary depending on the voltage Vb, and the magnitude of the current Ie equal to the sum of Ib and Ic also varies depending on the voltage Vb. As a result, it becomes possible to control the current Ic or Ie by changing the voltage Vb.

Consequently, the nonlinear device operates like a bipolar transistor formed by the first organic layer as an emitter, the second organic layer as a collector and the metal layer sandwiched therebetween as a base.

The currents IC and Ie pass through the organic layers not in a planar direction but in the thickness direction. Accordingly, the passing distance is very short, and a sufficient function is attained even if the organic layers show a relatively low mobility.

On the other hand, the current Ib flows in the planar direction but within the metal layer, and this is of no problem if the metal layer shows a low resistivity.

Accordingly, the organic layers can be formed by selection from a broader class of organic materials including those showing a relatively low mobility than the conventional organic transistors.

In the above-mentioned nonlinear device, if the metal layer has a substantial thickness exceeding a certain level, a substantial portion of electrons emitted out of the first organic layer are scattered in the metal layer to lose the energy, and the number of electrons reaching the second organic layer is liable to be remarkably decreased. Accordingly, the metal layer thickness is desirably as small as possible, and a thickness of around 100 Å may be appropriate also in view of easiness of the uniform layer formation.

Electrons scattered in the metal layer form the current Ib flowing through the metal layer in the planar direction, so that Ib is generally liable to increase and Ic is liable to decrease correspondingly. In order to flow a larger current to the organic EL element, it is preferred to connect the first organic layer side of the nonlinear device to the anode of the organic EL element, thereby flowing the current Ie to the organic EL element, than to connect the second organic layer side of the nonlinear device to the cathode of the organic EL element so as to flow the current Ic to the organic EL element.

Figure 5:
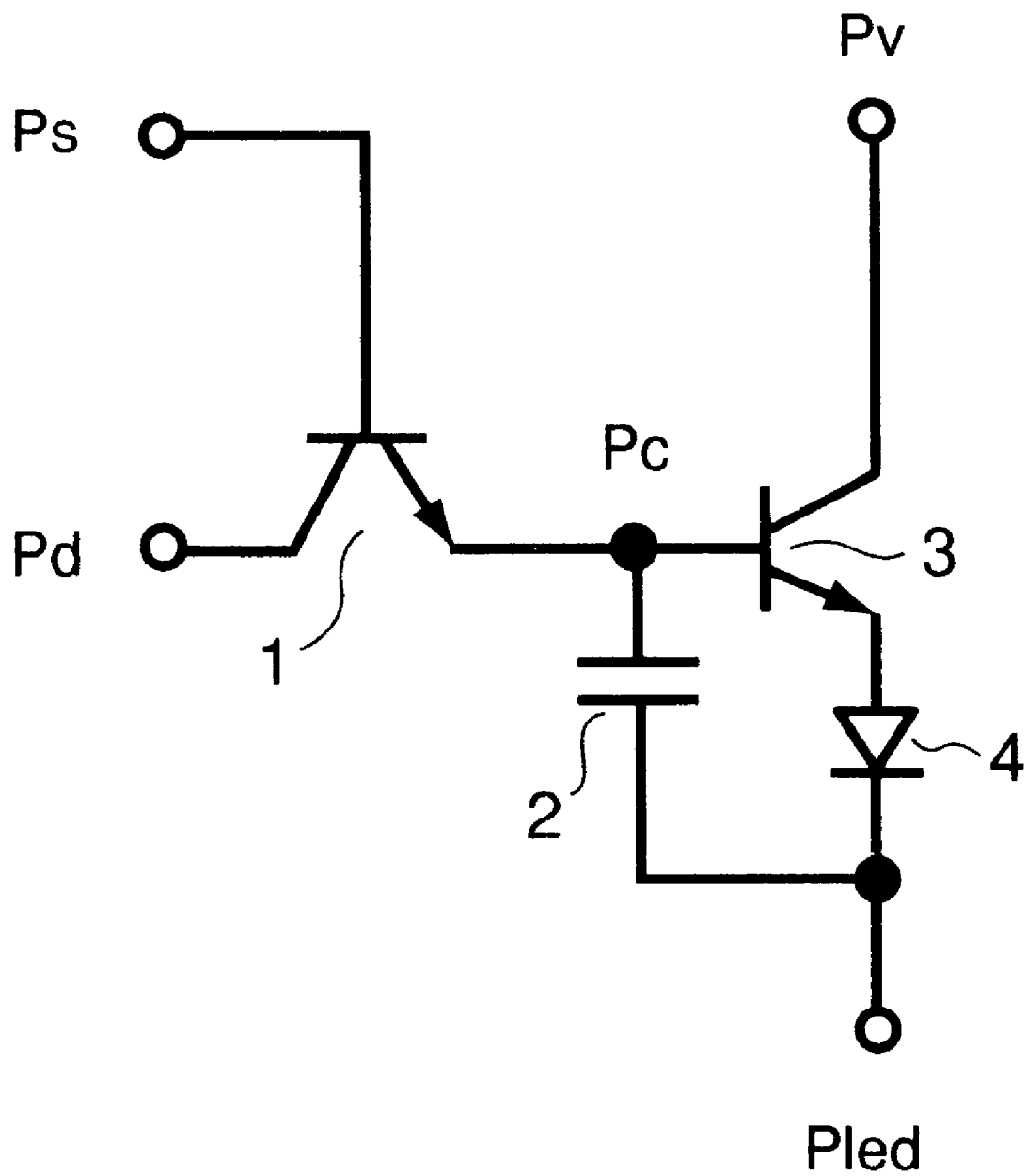
FIG. 5 is an equivalent circuit diagram of one pixel of the organic electronic device shown in FIG. 1.

FIG. 5 is a diagram showing an equivalent circuit of one pixel of the organic electronic device.

Referring to FIG. 5, one pixel of the organic electronic device is represented by an equivalent circuit as shown, including a first nonlinear device 1, a storage capacitor 2, a second nonlinear device 3, and an organic EL element 4 of which an equivalent capacitance component and an equivalent resistance component have been omitted from showing.

The equivalent circuit further includes a (first) electrode Pd connected to the first organic layer of the first nonlinear device 1, an electrode Ps connected to the metal layer of the first nonlinear device 1, an electrode Pc connected to the storage capacitor 2 and the metal layer of the second nonlinear device 3, a (second) electrode Pv connected to the second organic layer of the second nonlinear device, and an electrode Pled connected to the cathode of the organic EL element 4.

At Ps is supplied a selection signal, at Pd is applied a data signal, and at Pc is developed a potential depending on the data signal through charge and discharge of the storage capacitor. Pv and Pled are placed at fixed potentials.

The circuit operates as follows.

A selection signal applied to Ps is placed in a selection state ("HIGH"), the potential at Ps is raised to turn on the first nonlinear device 1, whereby a current corresponding a data signal supplied to Pd flows into the storage capacitor 2 to raise the potential at the metal layer of the second nonlinear device 3 depending on the data signal. As a result, a current corresponding to the data signal flows through the nonlinear device 3 to an organic EL element 4, whereby the organic EL element 4 causes luminescence at a luminance depending on the data signal.

On the other hand, if the selection signal applied to Ps is placed in a non-selection state ("LOW"), the first nonlinear device 1 is placed in the interrupting state, whereby no current flows through the first nonlinear device 1 to the storage capacitor 2 even if the data signal at Pd is changed, so that the luminescence of the organic EL device 4 is not substantially affected thereby.

Figure 10:
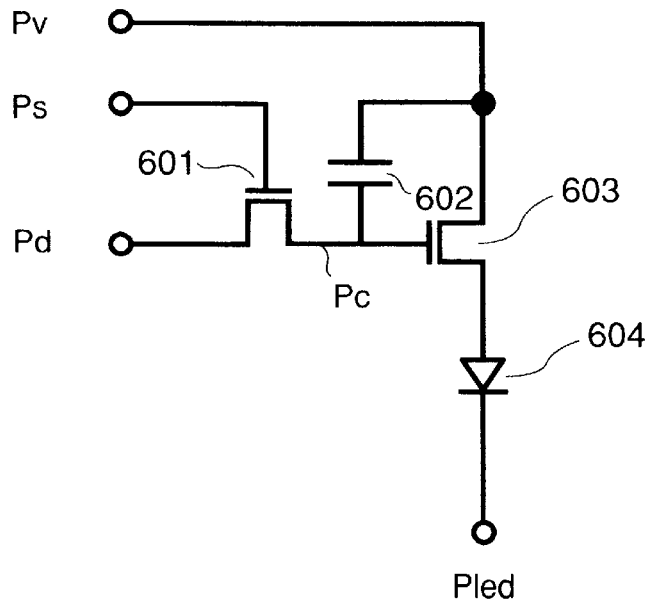
FIG. 10 is an equivalent circuit diagram of one pixel of an organic electronic device (organic EL device).
Figure 11:
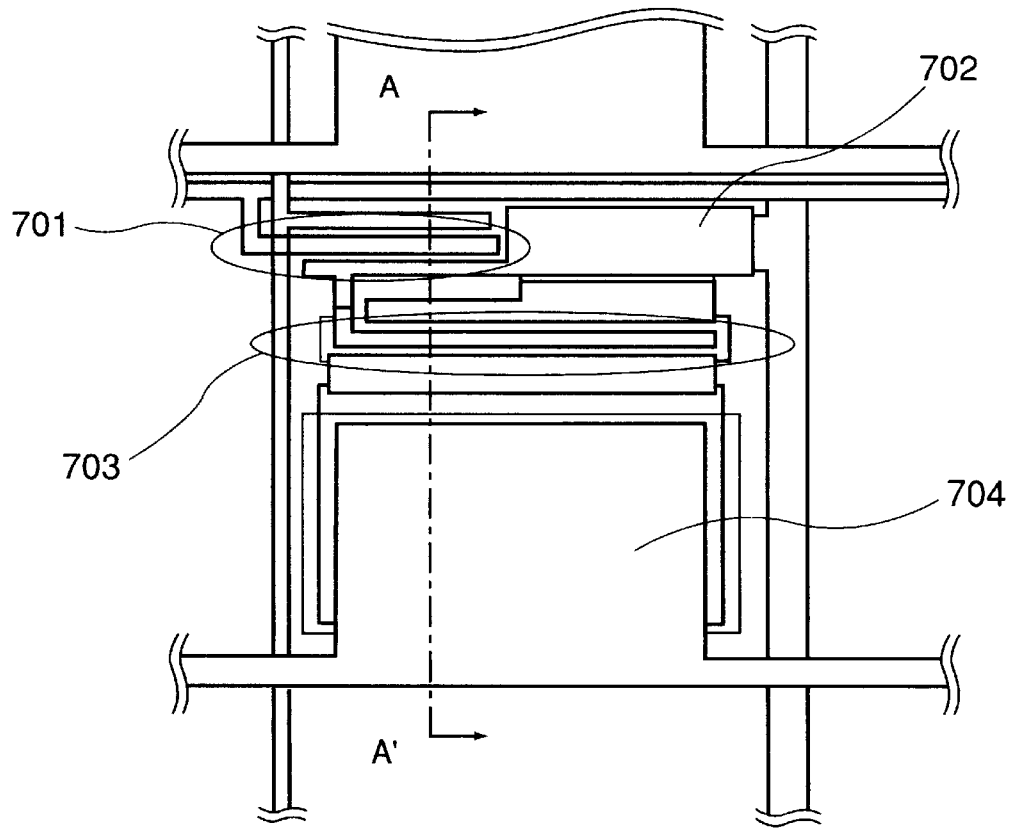
FIG. 11 is a corresponding plan view of such one pixel of an organic electronic device.
Figure 12:
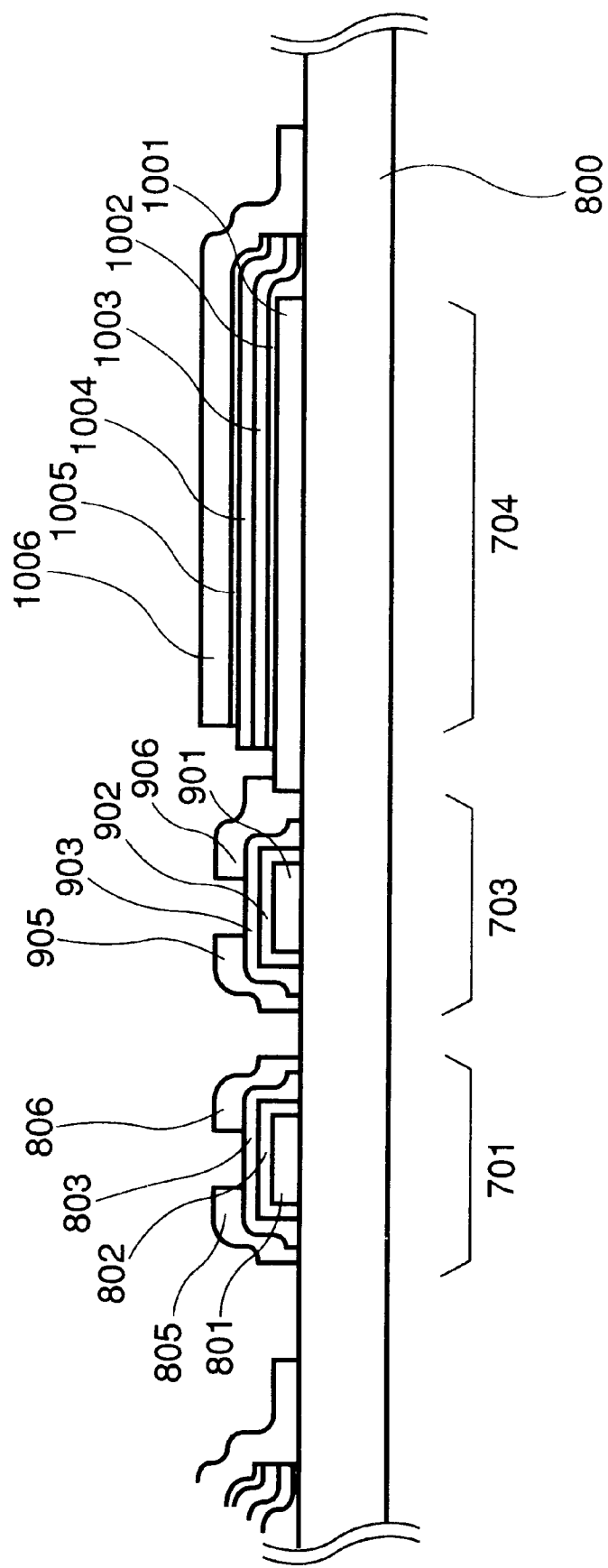
FIG. 12 is a partial sectional view of one pixel region of such an organic electronic device.

Thus, in this Example, a similar operation as in the conventional organic EL device explained with reference to FIGS. 10–12 is performed by using two nonlinear devices each comprising a thin metal layer disposed between organic layers instead of the two transistors in the conventional device.

In this Example, the first organic layer of the second nonlinear device is connected to the anode of the organic EL element. As mentioned above, this is effective to flow a larger amount of current to the organic EL element. If a sufficient current flows through the second nonlinear device, however, it is of course possible to connect the second organic layer to the cathode of the organic EL element.

Example 2

A second Example of the present invention will be described.

Figure 6:
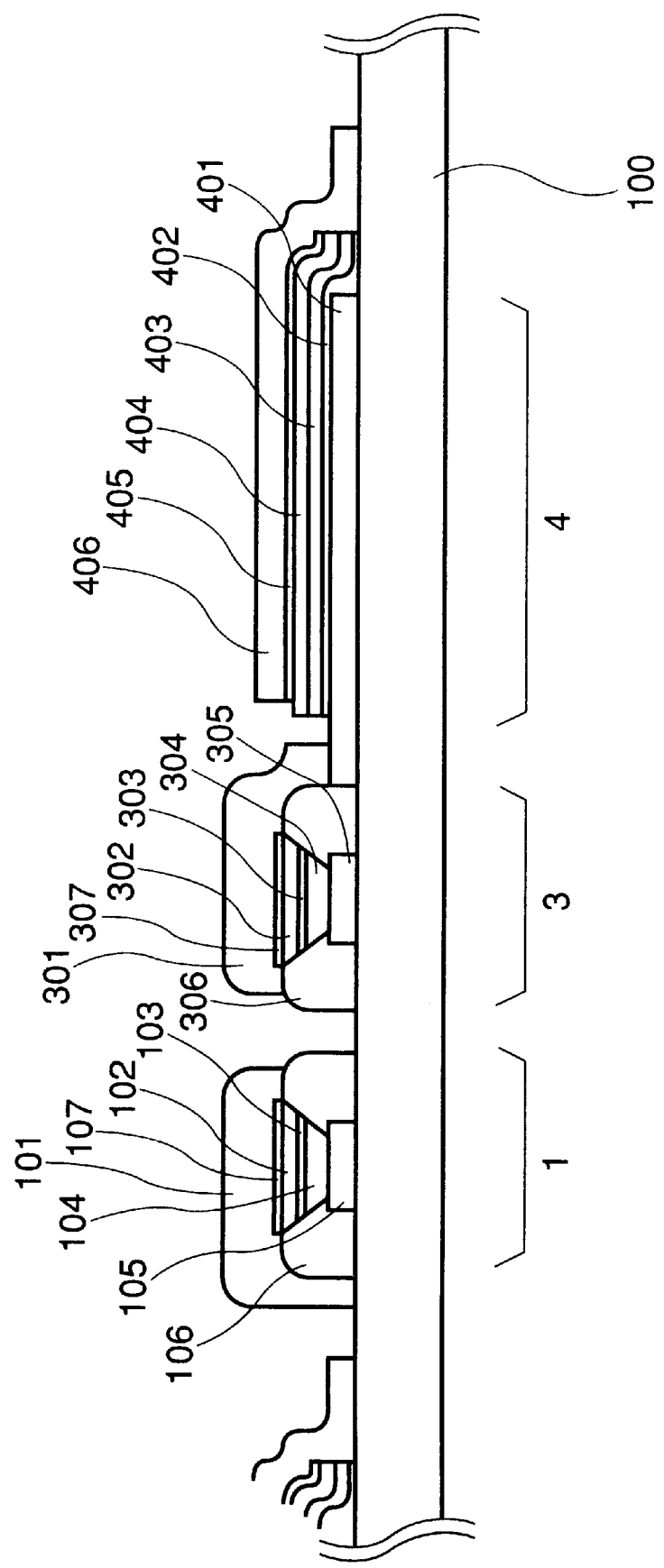
FIGS. 6 and 7 are partial sectional views of organic electronic devices of Examples 2 and 3, respectively.

In this Example, as shown in FIG. 6, an electrode connected to an organic layer of a nonlinear device having a metal layer sandwiched between organic layers is composed of not a single Al layer 101 (or 301) but also a laminate of an Al layer 101 (or 301) and an AlLi layer 17 (or 307). Li has a Fermi level higher than that of Al, and accordingly if a Li-containing layer is inserted between an Al layer and an organic layer, the energy level gap at the boundary is alleviated to make easy the injection of electrons from the electrode to the organic layer, so that a larger current can be passed through a nonlinear device.

A similar effect is attained by using a layer of AlLi alloy having a relatively low Li content or a non-metallic Li compound, such as LiF.

The other structures are similar to those described with reference to FIGS. 1 to 5.

Example 3

In this Example, a first nonlinear device functioning as an organic diode is used.

Figure 7:
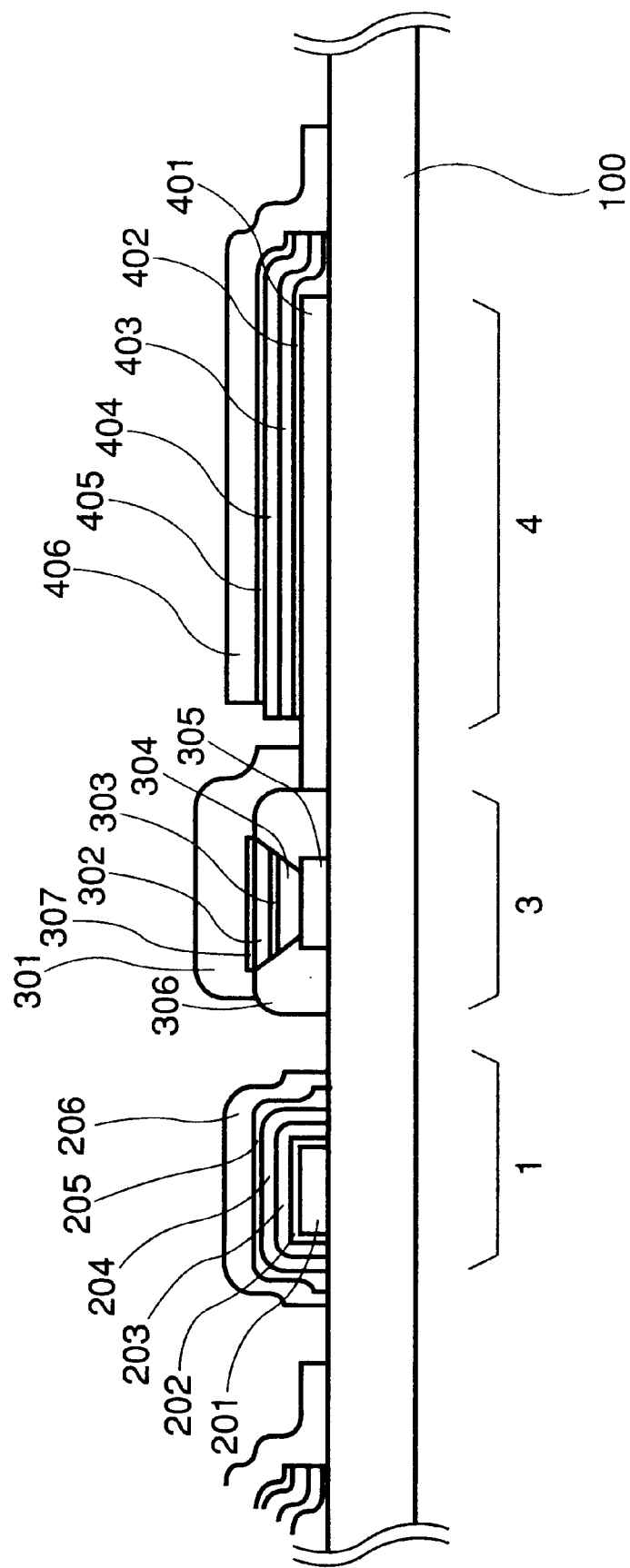

FIG. 7 is a partial sectional view showing one region of an organic electronic device (organic EL device) according to this Example.

Referring to FIG. 7, one pixel region of the organic electronic device includes a first nonlinear device 1, (a storage capacitor (not shown disposed behind the nonlinear device) a second nonlinear device 3 and an organic EL element 4 disposed on a common substrate 100.

The first nonlinear device 1 includes an anode 201 of Au of, e.g., 1000 Å in thickness, a hole-injection layer 202 of copper phthalocyanine of, e.g., 300 Å in thickness, an organic hole-transporting layer 203 of aromatic diamine, an organic electron-transporting layer 204 of tris(8-quinolynol) aluminum complex of, e.g., 600 Å in thickness, an electron-injection layer 205 of LiF of, e.g., 100 Å in thickness and a cathode 206 of Al of, e.g., 1000 Å in thickness.

The second nonlinear device 3 and the organic EL element 4 have similar structures as in Example 2.

Figure 8:
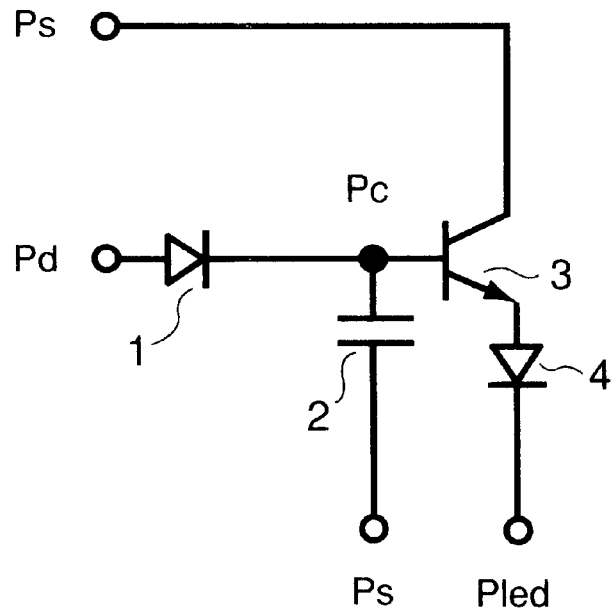
FIG. 8 is an equivalent circuit diagram of one pixel of the organic electronic device shown in FIG. 7.
Figure 9:
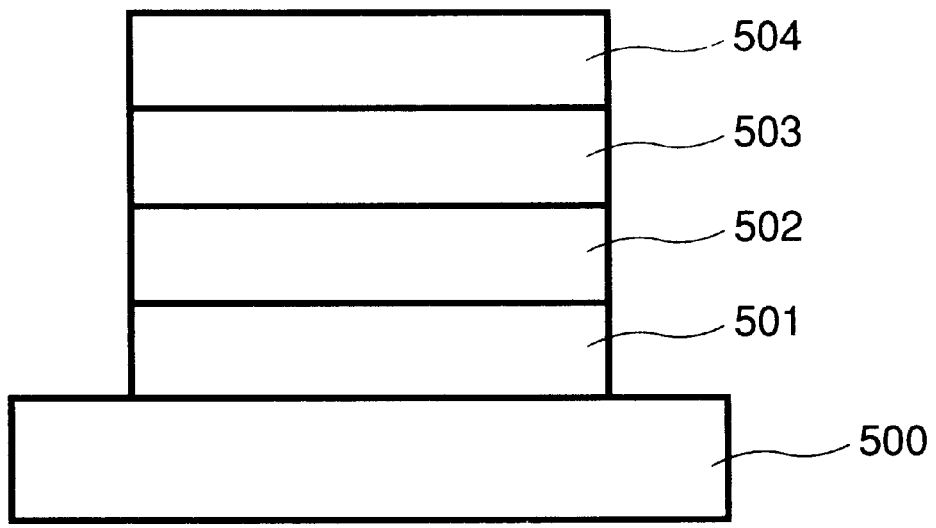
FIG. 9 is a schematic sectional view showing a representative laminar structure of an organic EL device.

FIG. 8 is a diagram showing an equivalent circuit of one pixel of the organic electronic device of this Example.

Referring to FIG. 8, one pixel of the organic electronic device is represented by an equivalent circuit as shown, including a first nonlinear device 1, a storage capacitor 2, a second nonlinear device 3, and an organic EL element 4 of which an equivalent capacitance component and an equivalent resistance component have been omitted from showing.

The equivalent circuit further includes a (first) electrode Pd connected to the first anode of the first nonlinear device 1, an electrode Ps connected to the first side of the storage capacitor 2, an electrode Pc connected to the second side of the storage capacitor 2 and the metal layer of the second nonlinear device 3, a (second) electrode Pv connected to the second organic layer of the second nonlinear device 3, and an electrode Pled connected to the cathode of the organic EL element 4.

At Ps is supplied a selection signal, at Pd is applied a data signal, and at Pc is developed a potential depending on the data signal through charge and discharge of the storage capacitor. Pv and Pled are placed at fixed potentials.

The circuit operates as follows.

A selection signal applied to Ps is placed in a selection state ("LOW"), the potential at Ps is lowered to turn on the first nonlinear device 1, whereby a current corresponding a data signal supplied to Pd flows into the storage capacitor 2 to store a charge thereat depending on the data signal. When the selection signal applied to Ps is restored to a non-selection state ("HIGH"), the potential at Pc, i.e., at the metal layer of the second nonlinear device 3 is raised to a potential which corresponds to a sum of the original potential and a voltage increase caused by a signal charge stored corresponding to the data signal. As a result, a current corresponding to the data signal flows through the second nonlinear device 3 to an organic EL element 4, whereby the organic EL element 4 causes luminescence at a luminance corresponding to the data signal. Simultaneously, the first nonlinear device 1 is placed in the interrupting state, whereby no current flows through the first nonlinear device 1 to the storage capacitor 2 even if the data signal of Pd is changed, so that the luminescence of the organic EL element 4 is not substantially affected.

In this Example, the first nonlinear device 1 has a similar structure as the organic EL device 4 to function as a diode. Thus, the first nonlinear device can assume a form of a diode. Such a nonlinear device functioning as a diode is advantageous that it is easy to prepare compared with a nonlinear device functioning as a transistor.

As described above with reference to some embodiments and examples, according to the present invention, there is provided an organic electronic device including an organic EL device and a nonlinear device, wherein the nonlinear device has a structure including at least one metal layer sandwiched between organic layers so as to flow a current through the metal layer between the organic layers sandwiching the metal layer. As a result, an obstacle to commercialization of a conventional organic transistor that it requires a special organic material having a remarkably high mobility in the active organic layer, can be alleviated to provide a remarkably broader latitude of material selection. Accordingly, it becomes possible to obtain an inexpensive organic electronic device, particularly an organic EL display panel which is easy to produce and is highly reliable. The present invention further provides an inexpensive nonlinear device which is easy to produce and highly reliable.

What is claimed is:

1. An organic electronic device, comprising a common substrate; an organic luminescence device formed on the common substrate and comprising an anode, a cathode and an organic luminescence layer disposed between the anode and cathode; and a nonlinear device formed on the common substrate for controlling a current flowing to the organic luminescence device;

wherein the nonlinear device has a structure including a first organic layer and a second organic layer each comprising an organic material, and at least one metal layer principally comprising a metal element and sandwiched between the first and second organic layers so as to flow at least a part of current flowing through the metal layer between the first and second organic layers sandwiching the metal layer.

2. The organic electronic device according to claim 1, wherein the metal layer and the first and second organic layers are respectively connected to other circuit devices formed on the common substrate, whereby the nonlinear device is operated by changing a potential difference between the metal layer and the first or second organic layer to cause a change in current flow between the first and second organic layers.

3. The organic electronic device according to claim 2, wherein at least one of the first and second organic layers of the nonlinear device comprises a molecule having a LUMO level higher than a Fermi level of the metal layer.

4. A nonlinear device, comprising a first electrode, a first organic layer, a metal layer, a second organic layer and a second electrode, wherein the first organic layer, the metal layer, and the second organic layer have a laminated structure and are disposed between the first electrode and the second electrode, and wherein the metal layer is disposed between the first organic layer and the second organic layer so that a current flows from the first electrode to the second electrode through the first organic layer, the metal layer, and the second organic layer when a selection signal applied to the metal layer is in a selection state.

5. The nonlinear device according to claim 4, operatable by changing a potential difference between the metal layer and the first or second organic layer to cause a change in current flow between the first and second organic layers.

6. The nonlinear device according to claim 5, wherein at least one of the first and second organic layers comprises a molecule having a LUMO level higher than a Fermi level of the metal layer.

* * * * *